United States Patent
Ko et al.

(10) Patent No.: US 7,968,995 B2
(45) Date of Patent: Jun. 28, 2011

(54) INTEGRATED CIRCUIT PACKAGING SYSTEM WITH PACKAGE-ON-PACKAGE AND METHOD OF MANUFACTURE THEREOF

(75) Inventors: Chan Hoon Ko, Ichon si (KR); Soo-San Park, Seoul (KR); HeeJo Chi, Ichon si (KR)

(73) Assignee: Stats Chippac Ltd., Singapore (SG)

( * ) Notice: Subject to any disclaimer, the term of this patent is extended or adjusted under 35 U.S.C. 154(b) by 99 days.

(21) Appl. No.: 12/483,087

(22) Filed: Jun. 11, 2009

(65) Prior Publication Data

US 2010/0314736 A1   Dec. 16, 2010

(51) Int. Cl.
    *H01L 23/02* (2006.01)
(52) U.S. Cl. .. 257/686; 257/777; 257/778; 257/E21.052
(58) Field of Classification Search ............... 257/777, 257/686, 778, E21.052
    See application file for complete search history.

(56) References Cited

U.S. PATENT DOCUMENTS

| | | | |
|---|---|---|---|
| 7,061,103 B2* | 6/2006 | Chen et al. | 257/713 |
| 7,518,224 B2* | 4/2009 | Shim et al. | 257/686 |
| 7,812,435 B2* | 10/2010 | Park et al. | 257/685 |
| 2006/0256525 A1 | 11/2006 | Shim et al. | |
| 2007/0190690 A1 | 8/2007 | Chow et al. | |
| 2009/0057861 A1 | 3/2009 | Park et al. | |
| 2009/0057864 A1 | 3/2009 | Choi et al. | |

\* cited by examiner

*Primary Examiner* — Thien F Tran
(74) *Attorney, Agent, or Firm* — Mikio Ishimaru

(57) ABSTRACT

A method of manufacture an integrated circuit packaging system includes: providing a base substrate; mounting a first base integrated circuit over the base substrate; mounting a second base integrated circuit over the first base integrated circuit; attaching a stacking interconnect to the base substrate and adjacent to the first base integrated circuit; and forming a base encapsulation, having a recess portion from a corner of the base encapsulation and a step portion adjacent to the recess portion, with the step portion over the second base integrated circuit and the recess portion exposing the stacking interconnect.

20 Claims, 2 Drawing Sheets

INTEGRATED CIRCUIT PACKAGING SYSTEM WITH PACKAGE-ON-PACKAGE AND METHOD OF MANUFACTURE THEREOF

TECHNICAL FIELD

The present invention relates generally to an integrated circuit packaging system, and more particularly to a system for an integrated circuit packaging system with package-on-package.

BACKGROUND ART

Important and constant goals of the computer industry include higher performance, lower cost, increased miniaturization of components, and greater packaging density for integrated circuits ("ICs"). Semiconductor package structures continue to become thinner and ever more miniaturized. This results in increased component density in semiconductor packages and decreased sizes of the IC products in which the packages are used.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner.

One method to further increase IC density is to stack semiconductor chips vertically. Multiple stacked chips can be combined into a single package in this manner with a very small surface area or "footprint" on the PCB or other substrate. This solution of stacking IC components vertically has in fact been extended to the stacking of entire packages upon each other. Such package-on-package ("PoP") configurations continue to become increasingly popular as the semiconductor industry continues to demand semiconductor devices with lower costs, higher performance, increased miniaturization, and greater packaging densities. Continuing substantial improvements in PoP solutions are thus greatly needed to address these requirements.

Thus, a need still remains for an integrated circuit packaging system providing thinner, less expensive, and reliable PoP systems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; mounting a first base integrated circuit over the base substrate; mounting a second base integrated circuit over the first base integrated circuit; attaching a stacking interconnect to the base substrate and adjacent to the first base integrated circuit; and forming a base encapsulation, having a recess portion from a corner of the base encapsulation and a step portion adjacent to the recess portion, with the step portion over the second base integrated circuit and the recess portion exposing the stacking interconnect.

The present invention provides an integrated circuit packaging system, including: a base substrate; a first base integrated circuit over the base substrate; a second base integrated circuit over the first base integrated circuit; a stacking interconnect attached to the base substrate and adjacent to the first base integrated circuit; and a base encapsulation, having a recess portion from a corner of the base encapsulation and a step portion adjacent to the recess portion, with the step portion over the second base integrated circuit and the recess portion exposing the stacking interconnect.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
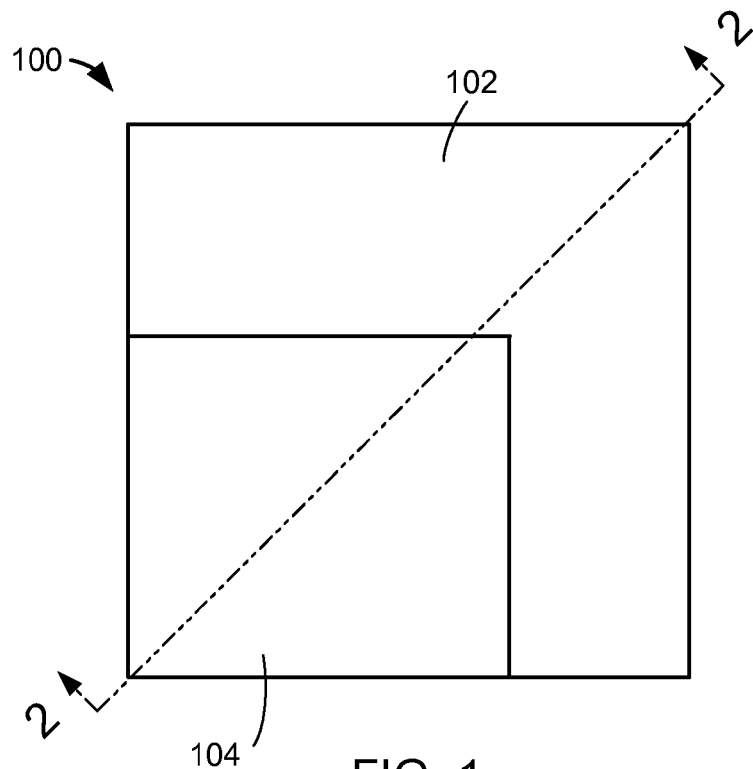
FIG. 1 is a top view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in an embodiment of the present invention. The top view depicts a base integrated circuit package 102, such as multi-chip package, and a stack integrated circuit package 104, such as an inner stack module (ISM) or a land-grid-array (LGA) package. The stack integrated circuit package 104 can be mounted over the base integrated circuit package 102 in an offset configuration to the base integrated circuit package 102.

Figure 2:
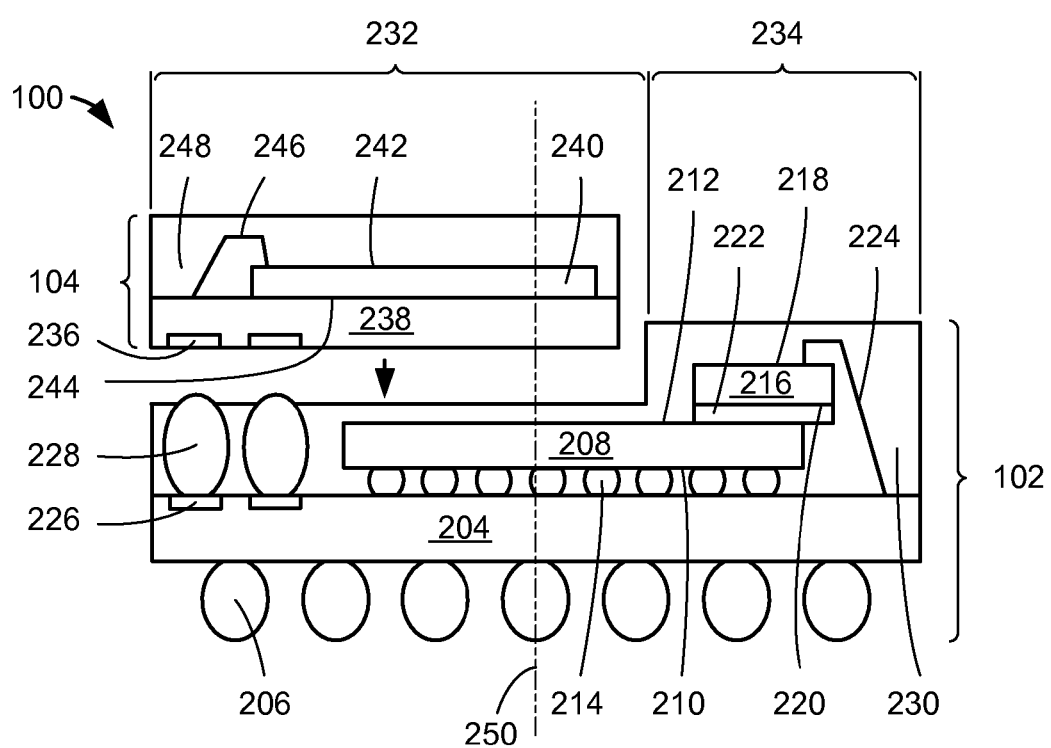
FIG. 2 is a cross-sectional view of an integrated circuit packaging system with package-on-package along a line 2-2 of FIG. 1.

Referring now to FIG. 2, therein is shown a cross-sectional view of the integrated circuit packaging system 100 along a line 2-2 of FIG. 1. The cross-sectional view depicts the stack integrated circuit package 104 being mounted over the base integrated circuit package 102.

The base integrated circuit package 102 can include a base substrate 204, such as a printed circuit board (PCB), a laminated plastic substrate, a laminated ceramic substrate, or a carrier. The base integrated circuit package 102 can include an external interconnect 206, such as a solder ball or a solder bump.

The base integrated circuit package 102 can include a first base integrated circuit 208, such as a flip chip or a wafer level chip scale package (WLCSP). The first base integrated circuit 208 can include a first base active side 210 and a first base inactive side 212 at an opposing side of the first base active side 210.

The first base active side 210 can include active circuitry (not shown) fabricated thereon. The first base inactive side 212 can be a backside of the first base integrated circuit 208. The first base integrated circuit 208 can be mounted over the base substrate 204 with the first base active side 210 facing the base substrate 204.

The first base integrated circuit 208 can include an electrical interconnect 214, such as a solder bump, a solder ball, or conductive post, can be attached to the first base active side 210. The first base integrated circuit 208 can be mounted over the base substrate 204 with the electrical interconnect 214 in between.

The base integrated circuit package 102 can include a second base integrated circuit 216, such as a wire-bondable integrated circuit, a wafer level chip scale package (WLCSP), or a bare die. The second base integrated circuit 216 can include the second base integrated circuit 216 having a second base active side 218 and a second base inactive side 220 at an opposing side of the second base active side 218.

The second base active side 218 can include active circuitry (not shown) fabricated thereon. The second base inactive side 220 can be a backside of the second base integrated circuit 216.

The second base integrated circuit 216 can be mounted over the first base integrated circuit 208 with a base attach layer 222, such as a die-attach adhesive or a film adhesive. The base attach layer 222 can be optionally attached to the second base inactive side 220 before the second base integrated circuit 216 is mounted over the first base integrated circuit 208.

The second base integrated circuit 216 can be mounted over the first base integrated circuit 208 with the second base inactive side 220 facing the first base integrated circuit 208. The second base integrated circuit 216 can form an overhang to the first base integrated circuit 208. A base internal interconnect 224, such as a bond wire, a ribbon bond wire, or a conductive wire, can attach the base substrate 204 and the second base active side 218.

The base substrate 204 can include an internal pad 226, such as an electrical contact, a contact pad or a solder on pad (SOP), for providing electrical connection to the base substrate 204, as an example. A stacking interconnect 228, a solder bump, a solder ball or a conductive post, can be attached to the internal pad 226. The stacking interconnect 228 can be adjacent the first base integrated circuit 208.

The base integrated circuit package 102 can include a base encapsulation 230, such as a cover including an epoxy molding compound, over the base substrate 204 covering the first base integrated circuit 208, the electrical interconnect 214, the second base integrated circuit 216, the base attach layer 222, and the base internal interconnect 224.

The base encapsulation 230 can partially expose the stacking interconnect 228. The stacking interconnect 228 surrounded by the base encapsulation 230 can form an embedded or exposed solder-on-pad (eSOP).

The base encapsulation 230 can include a recess portion 232 and a step portion 234 adjacent the recess portion 232. The recess portion 232 is shown exposing the stacking interconnect 228. The recess portion 232 is over a portion of the base substrate 204 and the first base integrated circuit 208, as an example. The step portion 234 can cover the second base integrated circuit 216, the base internal interconnect 224, and a remaining portion of the base substrate 204 and the first base integrated circuit 208.

The stack integrated circuit package 104 is shown mounting over the base integrated circuit package 102 over the recess portion 232 and adjacent to the step portion 234. The stack integrated circuit package 104 can be mounted over and attached to the stacking interconnect 228 in the recess portion 232 adjacent the second base integrated circuit 216.

The base integrated circuit package 102 and the stack integrated circuit package 104 can be tested without assembly of the integrated circuit packaging system 100. This ensures known good devices (KGD) are used in the assembly of the integrated circuit packaging system 100. This improves manufacturing yield, reliability, and throughput while lowering cost.

The stack integrated circuit package 104 can include a stack substrate 238, such as a printed circuit board (PCB), a laminated plastic substrate, a laminated ceramic substrate, or a carrier. The stack integrated circuit package 104 can include the stack substrate 238 having a stacking pad 236, such as an external terminal or terminal pad. The stacking pad 236 can be attached over and to the stacking interconnect 228. The electrical and mechanical connection between the stack substrate 238 and the stacking interconnect 228 improves reliability by eliminating the delamination problem between the stack integrated circuit package 104 and the first base integrated circuit 208.

The stack integrated circuit package 104 can include a stack integrated circuit 240, such as a wirebond integrated circuit, a flip chip, a wafer level chip scale package (WLCSP), or a bare die. The stack integrated circuit 240 can include a stack active side 242 and a stack inactive side 244 at an opposing side of the stack active side 242.

The stack active side 242 can include active circuitry (not shown) fabricated thereon. The stack inactive side 244 can be a backside of the stack integrated circuit 240. The stack integrated circuit 240 can be mounted over the stack substrate 238 with the stack inactive side 244 facing the stack substrate 238. The stack integrated circuit package 104 can include a stack internal interconnect 246, such as a bond wire, a ribbon bond wire, or a conductive wire, attaching the stack substrate 238 and the stack active side 242.

The stack integrated circuit package 104 can include a stack encapsulation 248, such as a cover including an epoxy molding compound. The stack encapsulation 248 can be over the stack substrate 238 covering the stack integrated circuit 240 and the stack internal interconnect 246.

The stack integrated circuit package 104 can be mounted in the recess portion 232 at a non-center offset with the base integrated circuit package 102. The non-center offset with the base integrated circuit package 102 can include a configuration wherein the stack integrated circuit package 104 can be mounted away from a center 250 of the base integrated circuit package 102. The cross-sectional view depicts the center 250 as a dashed line representing a center line of the base integrated circuit package 102.

It has been discovered that the present invention provides the integrated circuit packaging system with improved reliability. The base integrated circuit package and the stack integrated circuit package can be pre-assembled and tested before assembly of the integrated circuit packaging system. Assembly of the integrated circuit packaging system with known good devices (KGD) improves the reliability and yield. The separation between the ISM or the stack integrated circuit package and the flip chip or the first base integrated circuit eliminates delamination risks at this interface in flip chip package in package (fcPiP) application.

It has also been discovered that the present invention provides the integrated circuit packaging system with reduced profile. The stacking interconnect is in the recess portion of the base encapsulation and adjacent the step portion resulting in a vertically reduced profile for the integrated circuit packaging system.

Figure 3:
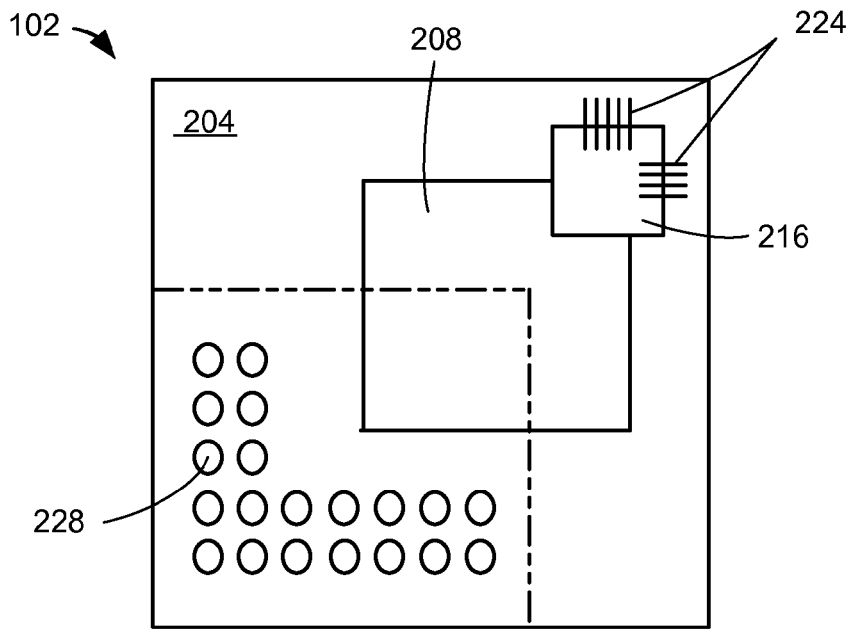
FIG. 3 is a top plan view of the base integrated circuit package of FIG. 1.

Referring now to FIG. 3, therein is shown a top plan view of the base integrated circuit package 102 of FIG. 1. The top plan view is shown without the base encapsulation 230 of FIG. 2 exposing the stacking interconnect 228, the base integrated circuit package 102, and the stack integrated circuit package 104 of FIG. 1.

The top plan view depicts the location of the recess portion 232 of FIG. 2 by a long dash and two short dashed lines at the lower left hand corner of the base integrated circuit package 102. The adjacent area can represent the location of the step portion 234 of FIG. 2. Two rows of the stacking interconnect 228 are shown along the periphery of the location of the recess portion 232.

The top plan view also depicts the second base integrated circuit 216 overhanging a right hand upper corner of the first base integrated circuit 208. The base internal interconnect 224 are shown connecting the second base integrated circuit 216 and the base substrate 204.

Figure 4:
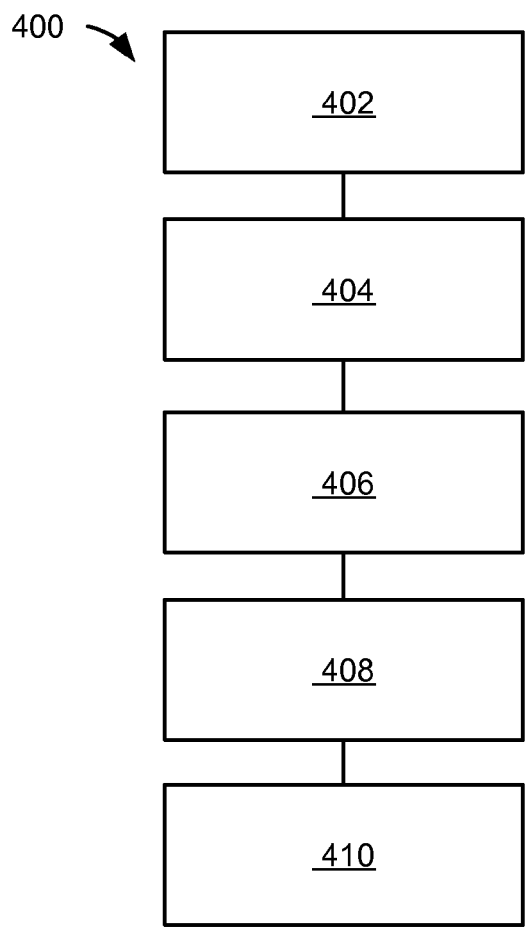
FIG. 4 is a flow chart of a method of manufacture of an integrated circuit packaging system in a further embodiment of the present invention.

Referring now to FIG. 4, therein is shown a flow chart of a method 400 of manufacture of an integrated circuit packaging system in a further embodiment of the present invention. The method 400 includes: providing a base substrate in a block 402; mounting a first base integrated circuit over the base substrate in a block 404; mounting a second base integrated circuit over the first base integrated circuit in a block 406; attaching a stacking interconnect to the base substrate and adjacent to the first base integrated circuit in a block 408; and forming a base encapsulation, having a recess portion from a corner of the base encapsulation and a step portion adjacent to the recess portion, with the step portion over the second base integrated circuit and the recess portion exposing the stacking interconnect in a block 410.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base substrate;
   mounting a first base integrated circuit over the base substrate;
   mounting a second base integrated circuit over the first base integrated circuit;
   attaching a stacking interconnect to the base substrate and adjacent to the first base integrated circuit; and
   forming a base encapsulation, having a recess portion from a corner of the base encapsulation and a step portion adjacent to the recess portion, with the step portion over the second base integrated circuit and the recess portion exposing the stacking interconnect.

2. The method as claimed in claim 1 further comprising mounting a stack integrated circuit package over the recess portion and to connect to the stacking interconnect exposed at the recess portion.

3. The method as claimed in claim 1 wherein:
   mounting the first base integrated circuit over the base substrate includes mounting a first base inactive side of the first base integrated circuit facing away from the base substrate; and
   mounting the second base integrated circuit over the first base integrated circuit includes mounting a second base inactive side of the second base integrated circuit facing the first base integrated circuit.

4. The method as claimed in claim 1 wherein mounting the second base integrated circuit over the first base integrated circuit includes overhanging the second base integrated circuit over the first base integrated circuit.

5. The method as claimed in claim 1 wherein forming the base encapsulation, having the recess portion from the corner of the base encapsulation and the step portion adjacent to the recess portion, with the step portion over the second base integrated circuit and the recess portion exposing the stacking interconnect includes forming the recess portion at least partially over the first base integrated circuit.

6. A method of manufacture of an integrated circuit packaging system comprising:
providing a base substrate;
mounting a first base integrated circuit over the base substrate;
mounting a second base integrated circuit over the first base integrated circuit with the second base integrated circuit overhanging the first base integrated circuit;
attaching a stacking interconnect to the base substrate and adjacent to the first base integrated circuit;
forming a base encapsulation, having a recess portion from a corner of the base encapsulation and a step portion adjacent to the recess portion, with the step portion over the second base integrated circuit and the recess portion exposing the stacking interconnect; and
attaching an external interconnect below the base substrate.

7. The method as claimed in claim 6 wherein mounting the second base integrated circuit over the first base integrated circuit with the second base integrated circuit overhanging the first base integrated circuit includes mounting the second base integrated circuit at an opposite corner of the base substrate as the recess portion of the base encapsulation.

8. The method as claimed in claim 6 further comprising mounting a stack integrated circuit package having a stack substrate to the stacking interconnect.

9. The method as claimed in claim 6 further comprising mounting a stack integrated circuit package adjacent to the step portion.

10. The method as claimed in claim 6 wherein:
mounting the first base integrated circuit includes mounting a flip chip; and
mounting the second base integrated circuit includes mounting an integrated circuit die.

11. An integrated circuit packaging system comprising:
a base substrate;
a first base integrated circuit over the base substrate;
a second base integrated circuit over the first base integrated circuit;
a stacking interconnect attached to the base substrate and adjacent to the first base integrated circuit; and
a base encapsulation, having a recess portion from a corner of the base encapsulation and a step portion adjacent to the recess portion, with the step portion over the second base integrated circuit and the recess portion exposing the stacking interconnect.

12. The system as claimed in claim 11 further comprising a stack integrated circuit package over the recess portion and connected to the stacking interconnect exposed at the recess portion.

13. The system as claimed in claim 11 wherein:
the first base integrated circuit over the base substrate includes mounting a first base inactive side of the first base integrated circuit facing away from the base substrate; and
the second base integrated circuit over the first base integrated circuit includes mounting a second base inactive side of the second base integrated circuit facing the first base integrated circuit.

14. The system as claimed in claim 11 wherein the second base integrated circuit overhangs the first base integrated circuit.

15. The system as claimed in claim 11 wherein forming the base encapsulation includes the recess portion at least partially over the first base integrated circuit.

16. The system as claimed in claim 11 wherein:
the second base integrated circuit overhangs the first base integrated circuit; and further comprising:
an external interconnect under the base substrate.

17. The system as claimed in claim 16 wherein the second base integrated circuit is at an opposite corner of the base substrate as the recess portion.

18. The system as claimed in claim 16 further comprising a stack integrated circuit package having a stack substrate mounted to the stacking interconnect.

19. The system as claimed in claim 16 further comprising a stack integrated circuit package adjacent to the step portion.

20. The system as claimed in claim 16 wherein:
the first base integrated circuit includes a flip chip; and
the second base integrated circuit includes an integrated circuit die.

* * * * *